United States Patent
Park et al.

(10) Patent No.: US 6,884,710 B2
(45) Date of Patent: Apr. 26, 2005

(54) SEMICONDUCTOR DEVICE HAVING MULTI-LAYER COPPER LINE AND METHOD OF FORMING SAME

(75) Inventors: Ki-Chul Park, Seoul (KR); Seung-Man Choi, Ohsan-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 10/338,908

(22) Filed: Jan. 9, 2003

(65) Prior Publication Data

US 2003/0100181 A1 May 29, 2003

Related U.S. Application Data

(62) Division of application No. 10/067,342, filed on Feb. 7, 2002, now Pat. No. 6,548,905.

(30) Foreign Application Priority Data

Feb. 12, 2001 (KR) .......................................... 2001-6812

(51) Int. Cl.[7] .............................................. H01L 21/44
(52) U.S. Cl. ...................................... 438/614; 438/687
(58) Field of Search ........................ 257/748, 751, 257/758, 761, 762, 773, 774; 438/614, 627, 624, 629, 637, 638, 641, 653, 666, 669

(56) References Cited

U.S. PATENT DOCUMENTS

| | | | | |
|---|---|---|---|---|
| 5,470,790 A | * | 11/1995 | Myers et al. ............... | 438/625 |
| 6,011,311 A | * | 1/2000 | Hsing et al. ................ | 257/774 |
| 6,040,243 A | * | 3/2000 | Li et al. ..................... | 438/687 |
| 6,150,723 A | | 11/2000 | Harper et al. | |
| 6,211,085 B1 | * | 4/2001 | Liu ............................ | 438/687 |
| 6,376,353 B1 | * | 4/2002 | Zhou et al. ................. | 438/612 |
| 6,476,489 B1 | * | 11/2002 | Yoo et al. ................... | 257/754 |
| 6,613,664 B2 | * | 9/2003 | Barth et al. ................ | 438/629 |

FOREIGN PATENT DOCUMENTS

| | | |
|---|---|---|
| JP | 799286 A | 4/1995 |
| JP | 10-261715 | 9/1998 |

* cited by examiner

*Primary Examiner*—Carl Whitehead, Jr.
*Assistant Examiner*—William Vesperman
(74) *Attorney, Agent, or Firm*—Volentine Francos & Whitt PLLC

(57) ABSTRACT

A semiconductor device includes a lower copper line formed on a substrate, an interlayer insulating layer formed on the lower copper line, and an upper copper line formed on the interlayer insulating layer. A copper via contact extends through the interlayer insulating layer for electrically connecting the lower copper line and the upper copper line. A concave recess is formed within the lower copper line and is vertically aligned and arranged below the copper via contact. A patterned barrier layer is formed at a bottom portion of the concave recess, such that the lower copper line and the copper via contact are directly electrically connected at an interface along sides of the concave recess, without an intervening barrier layer.

10 Claims, 4 Drawing Sheets

SEMICONDUCTOR DEVICE HAVING MULTI-LAYER COPPER LINE AND METHOD OF FORMING SAME

CROSS-REFERENCE TO RELATED APPLICATIONS

This is a divisional of application Ser. No. 10/067,342, filed Feb. 7, 2002 now U.S. Pat. No. 6,548,905 which is incorporated herein by reference in its entirety.

This application relies for priority upon Korean patent application No. 2001-006812, filed on Feb. 12, 2001, the contents of which are herein incorporated by reference in their entirety.

BACKGROUND OF THE INVENTION

1. Field of the Invention

The present invention generally relates to a semiconductor device having a multi-layer copper line. More specifically, the present invention is directed to a semiconductor device in which upper and lower layers are copper lines and a via contact hole is formed therebetween.

2. Description of the Related Art

As the integration density of semiconductor devices increases, circuit lines become more complex, making it difficult to layout and construct these complex circuits on just a single device layer. Accordingly, multi-layer circuit lines and patterns are used to achieve the desired performance result.

While tungsten may be employed as a conductive material for the circuit line, due to its ability to provide high step coverage necessitated by the increasing aspect ratios of present devices, the material of choice for the circuit lines is still aluminum. Despite its many advantages, the aluminum cannot completely fill a contact hole having a high aspect ratio.

Also, generally in high-integration semiconductor devices, the metal line width is reduced while the circuit line distance remains unchanged. As such, short circuits may result from electro-migration (EM) and circuit line resistance may increase. In effect, high-integration semiconductor devices suffer from circuit line resistance and contact resistance problems that do not occur in low-integration semiconductor devices.

To overcome the foregoing problems, copper has been employed as a circuit line material for semiconductor devices. Compared to aluminum, copper has a lower resistance, which mitigates the circuit line resistance and thereby increases the reliability of semiconductor products. Unfortunately, copper is not ideally suited for conventional semiconductor device patterning processes because the etchability of copper is lower than that of aluminum. In addition, copper is easily diffused into silicon and silicon oxide layers, resulting in short circuits or increases in leakage current and parasitic capacitance.

Various approaches have been developed for solving the problems that are caused by the use of copper as a circuit line conductor. One process is known as a damascene process. In the damascene process, a lower layer is etched to form a recess therein. Copper is deposited and planarized using a chemical mechanical polishing (CMP) technique such that the copper only remains in the recess. Thus, it is not necessary to directly pattern the copper. In order to solve the diffusion problem, a method of depositing a thin diffusion barrier layer and then forming the copper can be used.

Referring to FIG. 1, semiconductor devices (not shown for simplicity) are formed on a substrate 10 through a plurality of conventional fabrication processes. A first interlayer insulating layer 11 is formed to cover these devices, which devices will later connect to a circuit line. Accordingly, the first interlayer insulating layer 11 is patterned to form a contact hole for connecting the devices and the circuit line. A thin barrier layer 13 is then formed on the first interlayer insulating layer 11 containing the contact hole. A lower metal line 15 and a contact 17 are formed on the barrier layer 13. A thin barrier layer 19 is formed over the lower metal line 15. A second interlayer insulating layer 21 is then formed on the barrier layer 19. The metal line 15, the barrier layer 19, and the second interlayer insulating layer 21 are made of copper, silicon nitride, and silicon oxide, respectively.

Referring to FIG. 2, the upper surface of the second interlayer insulating layer 21 is patterned to form a recess for an upper metal line 25. More specifically, using a photoresist, openings for the recess are partially patterned to form a via hole. In this case, the barrier layer 19 is also etched to expose a part of the lower metal line 15. A barrier layer 23 is deposited to cover the recess and the sidewall and bottom of the via hole. Copper is then deposited to fill the recess and the via hole. Using a CMP process, the remaining barrier layer and the copper layer are removed to form a via contact and an upper metal line.

In such a multi-layer circuit line using copper, the barrier layer 23 is interposed between the lower metal line 15 and the upper metal line 25 including the copper layer of the via contact. With reference to the current flow, the barrier layer 23 is serially connected between the copper layers (lower metal line 15 and upper metal line 25). The barrier layer 23 is typically made of tantalum or tantalum nitride. Since the conductivity of tantalum or tantalum nitride is lower than that of copper, the resistance at the via contact interface becomes high.

Also, in the copper line, the density and current resistance become high, creating heat which causes electro-migration (EM). As the contact area is reduced in high integration devices, the current density in a via or a contact becomes higher than that in each layer line. The resulting EM can result in a open circuit. In some cases, the EM is intensified by a so-called current crowding phenomenon, in which the current density is crowded (or accumulates) at a corner where the layer line and the via contact intersect at a right angle.

Another problem is that in addition to the barrier layer preventing uniform connection of each layer copper line to a via contact, voids can be created during the formation of the layer.

Methods for solving the above-mentioned barrier layer problems are disclosed in Korea Patent Publication No. 1999-029770 and Japan Patent publication No. 10-261715. According to these methods, a lower copper line, a via hole, and a barrier layer are sequentially formed. The resulting structure is then etched back to remove the barrier layer on a bottom of the via hole. However, since[1] the etch-back technique removes the horizontally formed barrier layer on the bottom of an upper copper line in a dual damascene process, another barrier layer must previously have been deposited for preventing diffusion of the upper copper line.

SUMMARY OF THE INVENTION

It is therefore an object of the present invention to provide a semiconductor device which only removes a barrier layer at an interface between an upper copper line and a copper via contact, and a method of forming the same.

It is another object of the present invention to provide a semiconductor device which can prevent electro-migration, and a method of forming the same.

It is still another object of the present invention to provide a semiconductor device which can lower a resistance of a via contact interface at a multi-layer copper line, and a method of forming the same.

It is yet another object of the present invention to provide a semiconductor device which can increase product reliability and improve product characteristics by decreasing circuit resistance, and a method of forming the same.

According to an aspect of the invention, a semiconductor device is provided in which a lower copper line is formed on a substrate, an interlayer insulating layer is formed on the lower copper line, and an upper copper line is formed on the interlayer insulating layer. A copper via contact is formed within the interlayer insulating layer for electrically connecting the lower copper line and the upper copper line. A concave recess is formed within the lower copper line and is vertically aligned and arranged below the copper via contact. A patterned barrier layer is formed only at a bottom portion of the concave recess, wherein the lower copper line and the copper via contact are electrically connected at an interface along sides of the concave recess, without an intervening barrier layer.

According to another aspect of the invention, there is provided a method of forming a semiconductor device having a multi-layer line, including forming an insulating layer on a substrate containing circuit devices, forming a lower copper line on the insulating layer, and forming an interlayer insulating layer on the lower copper line. The interlayer insulating layer is patterned to form a groove in an upper surface thereof, and a via contact hole is formed in a lower surface of the groove, thereby exposing a portion of the lower copper line. A concave recess is formed at the exposed portion of the lower copper line, the concave recess being vertically aligned with, and arranged below, the via contact. A patterned barrier layer is formed at a bottom portion of the concave recess, along a sidewall of the via contact, and along the bottom surface and sides of the groove. The groove and the via contact are filled with copper to form an upper copper line, and thereby electrically connecting the upper copper line, the via contact and the lower copper line.

BRIEF DESCRIPTION OF THE DRAWINGS

The above objects and advantages of the present invention will become more apparent by describing in detail a preferred embodiment thereof with reference to the attached drawings in which.

DESCRIPTION OF PREFERRED EMBODIMENTS

Figure 1:
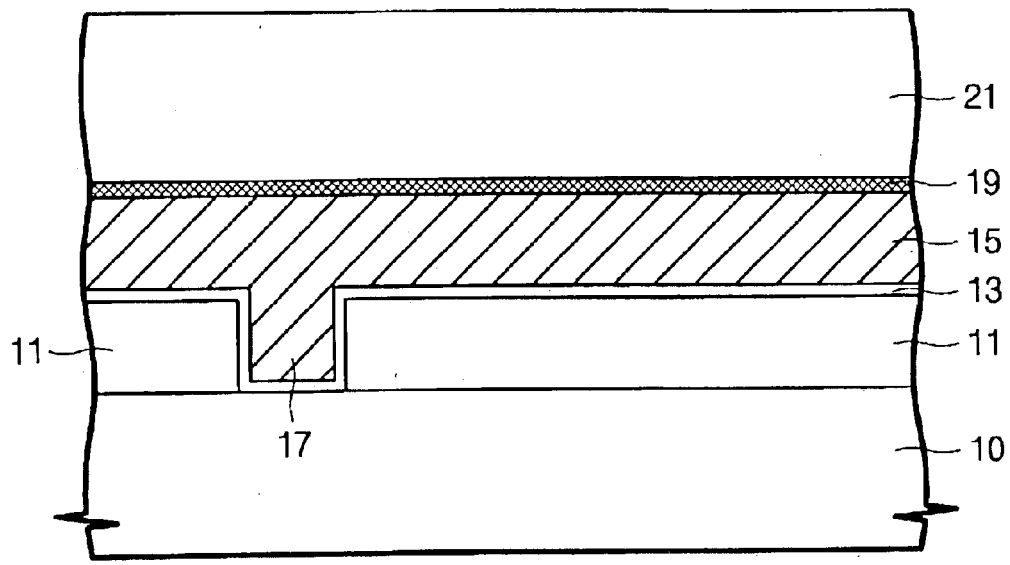
FIG. 1 and FIG. 2 are cross-sectional views showing the steps of forming a multi-layer copper line in accordance with a prior art.
Figure 2:
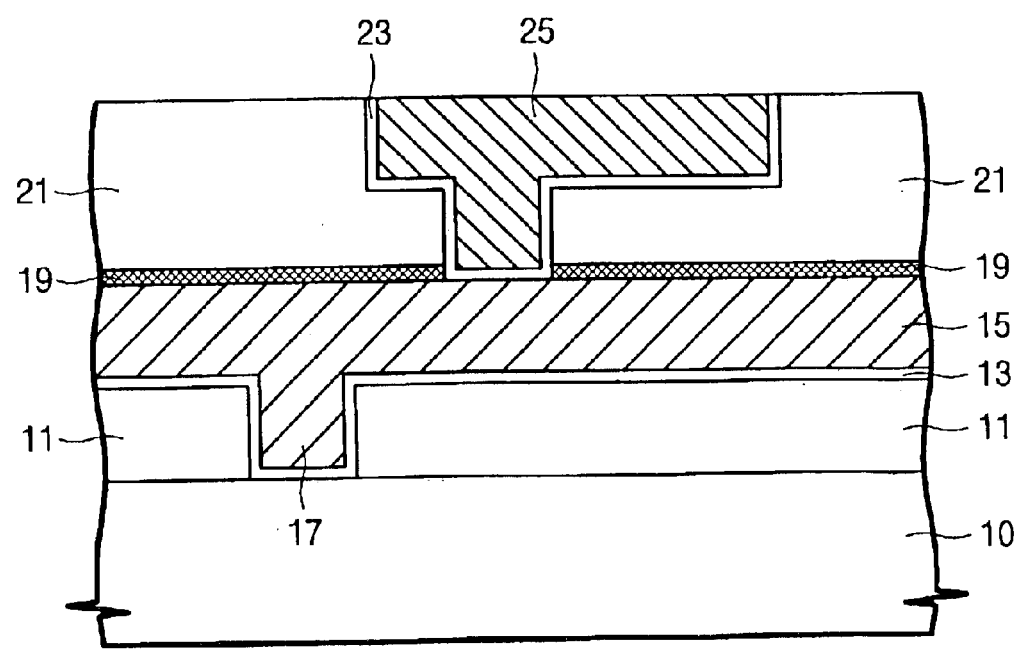

The present invention will now be described more fully with reference to the accompanying drawings, in which a preferred embodiment of the invention is shown. This invention may, however, be embodied in many different forms and should not be construed as being limited to the embodiments set forth herein. Rather, the embodiments are provided so that this disclosure will be thorough and complete, and will fully convey the concept of the invention to those skilled in the art. In the drawings, the thickness of a layer or region are exaggerated for clarity. It will also be understood that when a layer is referred to as being "on" another layer or substrate, it can be directly on the other layer or substrate, or intervening layers may also be present.

Figure 3:
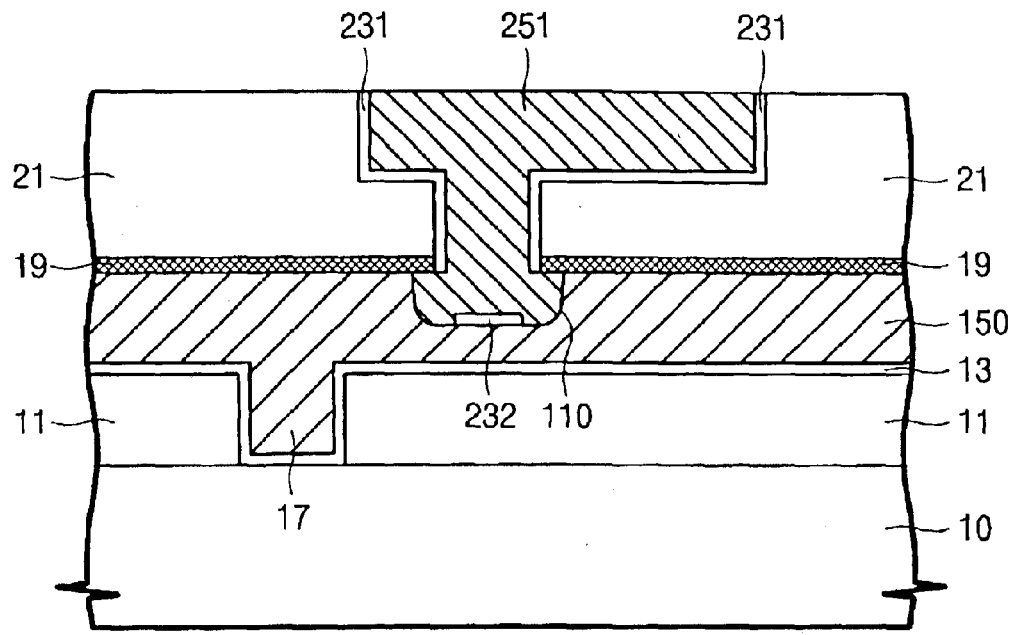
FIG. 3 is a cross-sectional view showing the formed state of a multi-layer copper line in accordance with the present invention.

FIG. 3 is a cross-sectional view showing the formed state of a multi-layer copper line in accordance with the present invention. The method of fabricating the multi-layer copper line will be described later. Referring to FIG. 3, a first interlayer insulating layer 11 is formed to cover devices (not shown) that are formed on a substrate 10. A contact hole is formed in the first interlayer insulating layer 11 to connect the devices to a circuit line. A thin barrier layer 13 is formed on an inner wall of the contact hole and along the upper surface of the first interlayer insulating layer 11. A lower copper line 150 is then formed, followed by the sequential formation of barrier layer 19 and a second interlayer insulating layer 21. The second interlayer insulating layer 21 is made of silicon oxide. An upper copper line 251 is formed within a portion of the second interlayer insulating layer 21.

A via contact is formed through the second interlayer insulating layer 21 and the barrier layer 19, connecting the lower metal line 150 and upper copper line 251. A patterned barrier layer 231 is formed on an inner side of the upper copper line 251 and a side of the via contact, i.e., on an interface between the second interlayer insulating layer 21 and the upper copper line 251 and the via contact.

A concave recess 110 is formed below the via contact in the lower copper line 150, and a patterned barrier layer 232 is formed on a portion of the bottom of the recess 110. Accordingly, if an electrical signal is applied from the upper copper line 251 through the via contact to the lower copper line 150 (i.e., in the direction of the current flow), it mainly flows along sides of the recess 110, without an intervening barrier layer.

Figure 4:
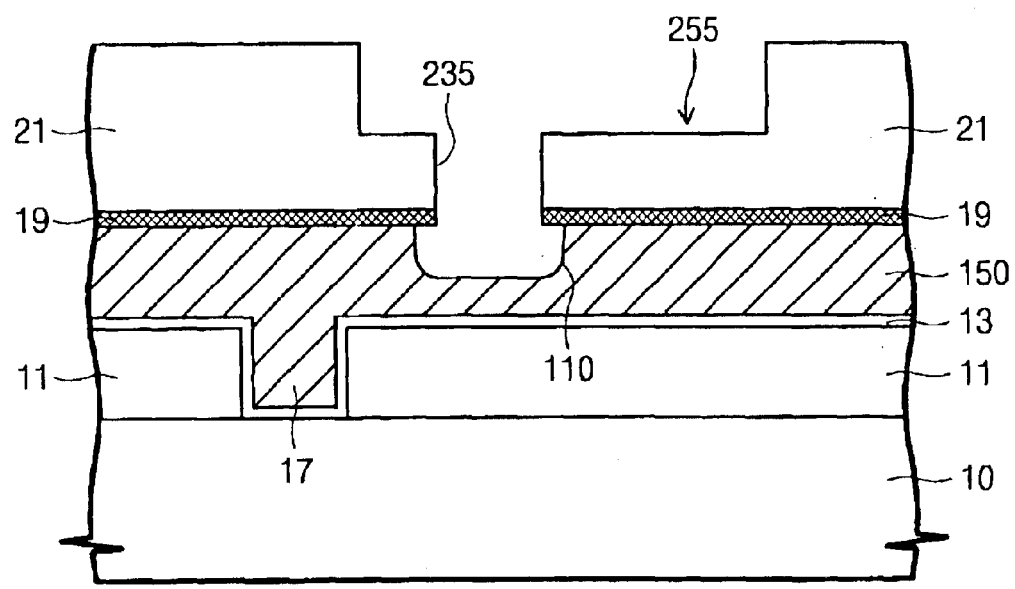
FIG. 4 through FIG. 7 are cross-sectional views showing the partial step of forming a dual damascene structure shown in FIG. 3.

FIG. 4 through FIG. 7 are cross-sectional views showing the partial step of forming the dual damascene structure shown in FIG. 3. Referring to FIG. 4, a groove 255 for an upper copper line is formed in the second interlayer insulating layer 21 by way of conventional patterning processes. Using a photoresist, a lower surface of the groove 255 is also patterned to form a via hole 235.

With this structure, the lower copper line 150 is exposed through the via hole 235, and it can then be subjected to an etching process, for example, a wet etch. In this embodiment, a dense nitric acid ($HNO_3$:$H_2O$ with a molar ratio of about 1:1) is used to etch the lower copper line 150. If the lower copper line 150 has a thickness of 3,000 Å, the etching of the exposed area progresses until about 1,500 Å is etched. It is understood that within the scope of this invention, the precise concentration of the etch solution, etch time, and temperature of the nitric acid may be altered by one of ordinary skill in the art, so as to produce a practical and suitable contact interface between upper and lower copper layers through the via contact.

The wet tech process thus forms recess 110 within a portion of the lower copper line 150. As shown in FIG. 4, the recess 110 also undercuts, or extends underneath, the non-conductive barrier layer 19 that is made of silicon nitride.

Generally, if the aspect ratio of the via contact is 2 or higher, a barrier layer is rarely formed at a sidewall part of the recess, i.e., a bottom corner part of the via contact. Thus, alternatively, the recess 110 may be formed using an anisotropic etch and an etch using a chemical etchant such as HF. The chemical etchant is used to etch copper oxide, which is formed when the exposed copper is oxidized to a constant thickness.

Figure 5:
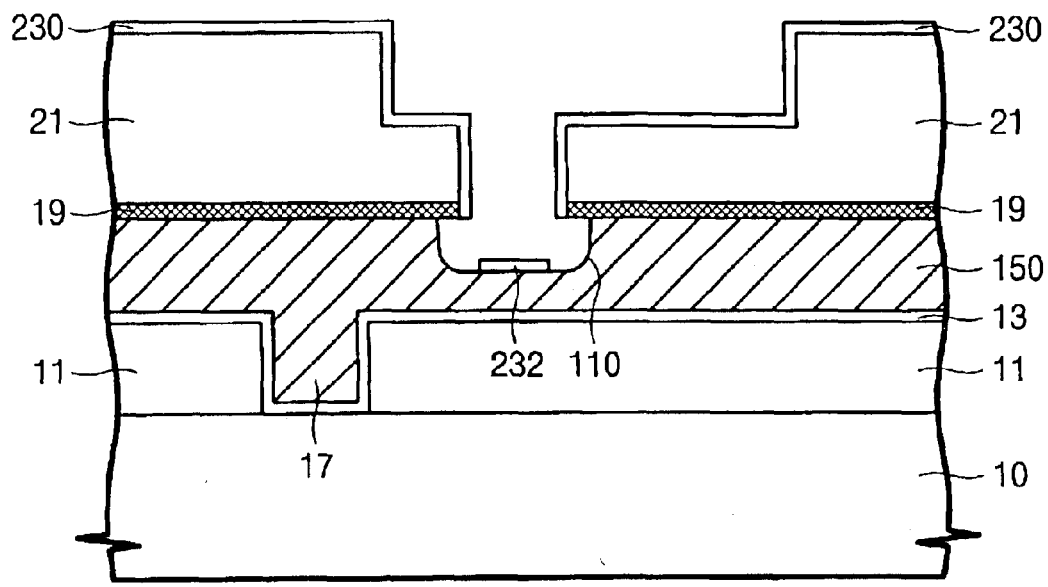

Referring also to FIG. 5, after the recess is formed, a barrier layer 230 is formed over the resulting structure. The barrier layer 230 is made of tantalum or tantalum nitride using a PVD (Physical Vapor Deposition) process, preferably sputtering. During the sputtering, a lower corner of the via hole 235 is relatively thinly covered with the barrier layer 230 in this embodiment. This is because the undercut creates an open area which mitigates the formation of the barrier layer 230 in the lower corner of the via hole 235. In particular, since the recess 110 having the undercut is formed in the lower coper line 150 and is vertically aligned with the via hole 235, the barrier layer 230 is formed on the second interlayer insulating layer 21, and a the same time, on a bottom of the recess 110 (shown as layer 232). However, because of the sputtering characteristics and the undercut interference, the barrier layer 230 is not formed around the recess 110 or along its sides.

Figure 6:
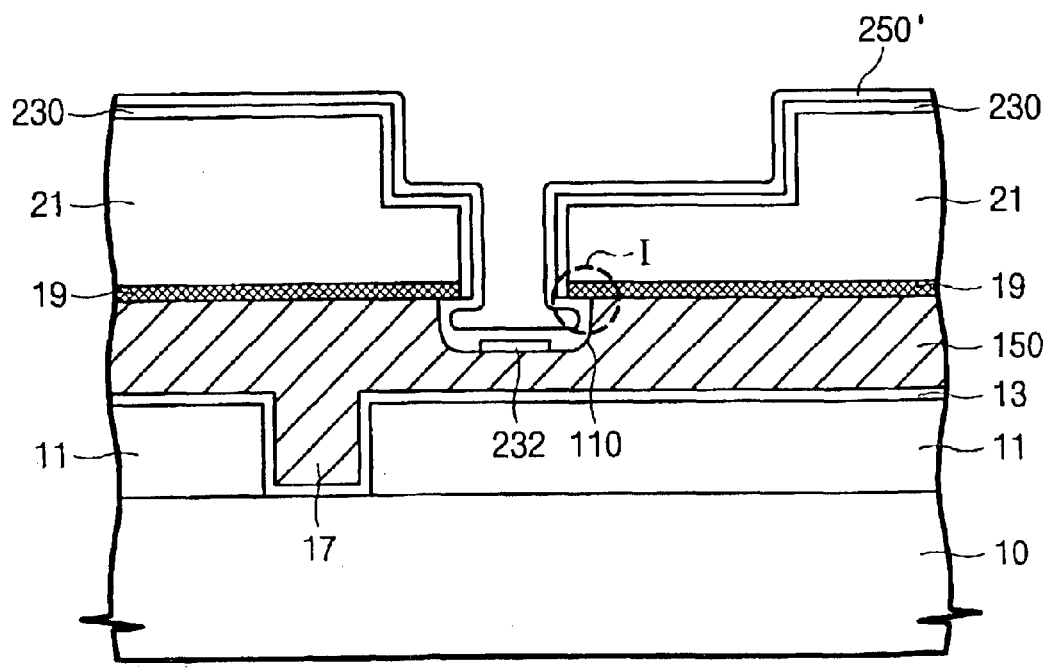

Referring to FIG. 6, a copper seed layer 250' is deposited, by a CVD (Chemical Vapor Deposition) process, over the entire surface of the structure, including an undercut portion "I" formed in the lower copper line 150. A CVD process is used because it has better gap filling characteristics, relative to gap filling using a sputtering process. A CVD process is also preferred over electroplating for the formation of the copper seed layer 250'.

Figure 7:
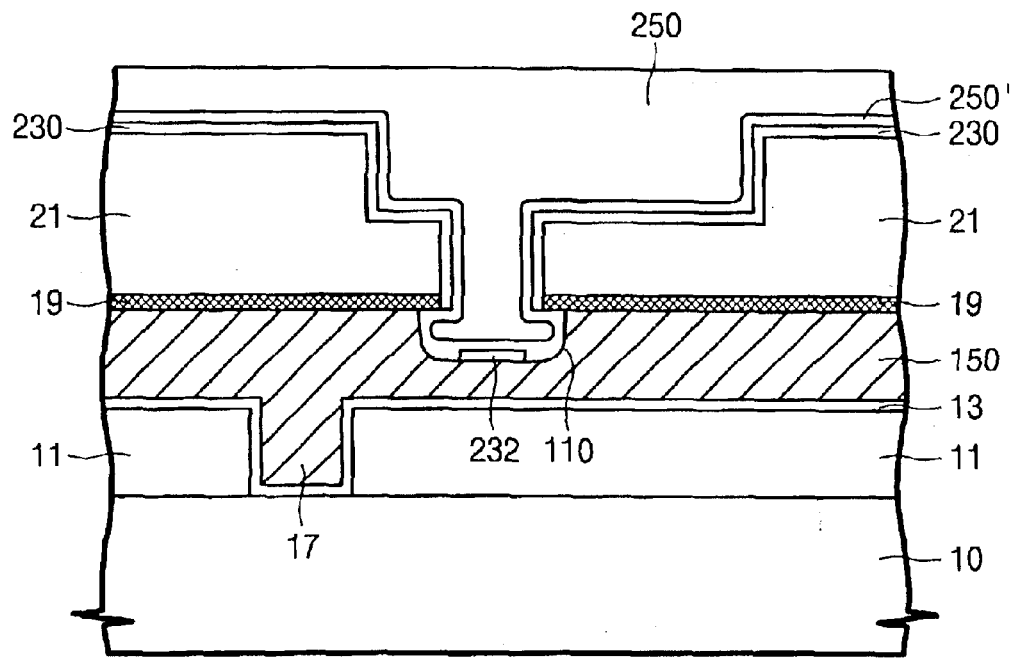

Referring to FIG. 7, after forming the copper seed layer 250', a bulk copper layer 250 is deposited to rapidly fill the groove 255 and via hole 235. Since a CVD copper layer is slowly grown, it is sufficient for the seed layer 250' to be formed by CVD, however, it is preferable that the bulk copper layer 250 be formed by electroplating because it is faster.

After the bulk copper layer 250 is formed, a CMP process is preferably used to planarize the structure (using the second interlayer insulating layer 21 as an etch stop), thus removing any remaining portions of the bulk copper layer 250, copper seed layer 250', and the barrier layer 230. This leaves the copper just in the groove 255 and the via hole 235. CMP is preferred over etch-back for planarization, since copper has inferior etching characteristics. As a result, an upper copper line 251 is formed as shown in FIG. 3 and the dual damascene process is completed. If an interlayer insulating layer or a protect layer of silicon or silicon oxide are formed on the upper copper line 251, a thin nonconductive barrier layer is formed previously.

Figure 8:
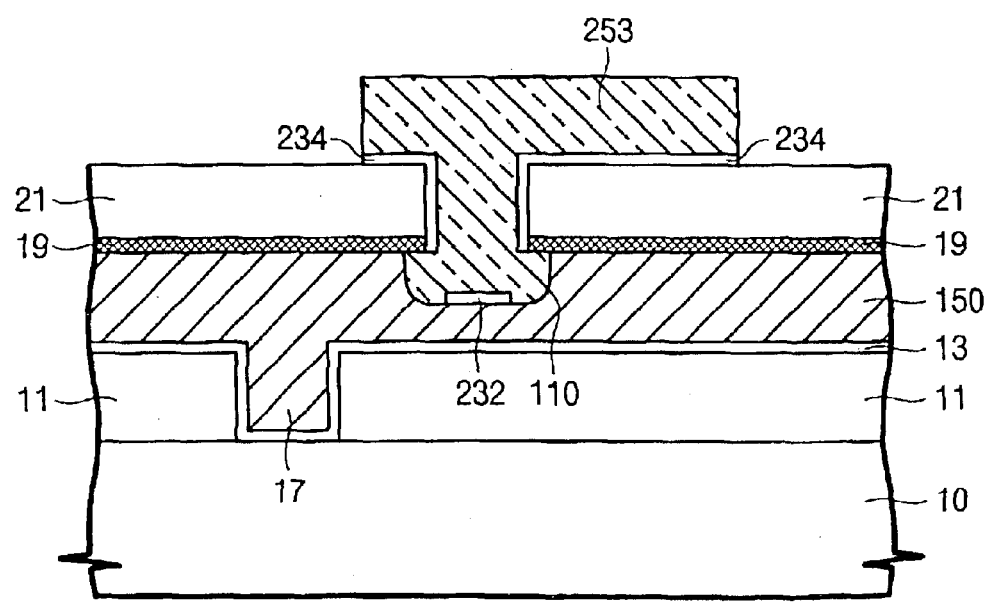
FIG. 8 is a cross-sectional view showing an example of an upper copper line formed through an etching process instead of a dual damascene process.

FIG. 8 is a cross-sectional view showing an example of an upper copper line formed through an etching process instead of a dual damascene process. Referring to FIG. 8, a via hole is formed through the second interlayer insulating layer 21 without forming the groove for an upper copper line. A lower copper line 150, which is exposed by formation of the via hole, is etched to form a recess 110. A barrier layer material is sputtered to form barrier layer 234 on the top of the second interlayer insulating layer 21, and at the same time, barrier layer 232 is formed on the bottom of the recess 110. A copper seed layer is conformally formed on the exposed surface of a substrate, and a copper layer is deposited using electroplating, to fill the via hole including the recess 110. The copper layer is also deposited on the second interlayer insulating layer 21 to a contact thickness. After forming an etching mask on the copper layer, a patterning etch is carried out to selectively remove the copper layer and the barrier layer 234 on the upper surface of the second insulating layer 21. Thus, an upper copper line 253 and a via contact are formed. The barrier layer 234 is formed on a bottom of the upper copper line 253 and a sidewall of the via contact, so that copper diffusion can-be prevented. The sides of the recess 110 form an interface between the upper copper line 253, lower copper line 150 and the via contact, without a barrier layer therebetween.

In either embodiment, to ensure a sufficient contact area, if the via contact is cylindrical, the depth of a recess formed in the lower copper line is preferably greater than a diameter of the via contact by about 25%.

While illustrative embodiments of the present invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

What is claimed is:

1. A method of forming a semiconductor device having a multi-layer line, comprising:

forming an insulating layer on a substrate containing circuit devices;

forming a lower copper line on the insulating layer;

forming an Interlayer insulating layer on the lower copper line;

patterning the Interlayer insulating layer to form a groove in an upper surface thereof, and forming a via contact hole in a lower surface of the groove, thereby exposing a portion of the lower copper line;

forming a concave recess at the exposed portion of the lower copper line, the concave recess being vertically aligned with, and arranged below, the via contact; and forming a patterned barrier layer at a bottom portion of the concave recess, along a sidewall of the via con tact. and along the lower surface and sides of the groove:

filling the groove and via contact with Copper to form en upper copper line, thereby directly electrically connecting the upper copper line, the via contact and the lower copper line.

2. The method of claim 1, further comprising forming an nonconductive barrier layer on the lower copper line before forming the interlayer insulating layer, wherein the nonconductive barrier layer Is etched in the step of forming the via contact hole.

3. The method of claim 1, wherein the forming of the concave recess continues until a depth of the recess is greater than a width of the via contact hole by about 25%.

4. The method of claim 1, wherein the forming of the concave recess is carried out using a wet etch process, and wherein the etching of the lower copper fine produces an undercut of the interlayer insulating layer.

5. The method of claim 1, wherein the patterned barrier layer is formed by sputtering, and the patterned barrier layer is composed of one of tantalum or tantalum nitride.

6. The method of claim 1, wherein the filling of the groove and via contact with copper comprises, forming a copper seed layer over the patterned barrier layer; and forming a bulk copper layer over the copper seed layer to fill the via contact hole and groove.

7. The method of claim 6, wherein the copper seed layer is formed by a chemical vapor deposition (CVD) process.

8. The method of claim 6, wherein the bulk copper layer is formed by an electroplating process.

9. The method of claim 4, wherein the wet etching is performed using a solution of nitric acid to diluted water of about 1:1.

10. The method of claim 1, wherein patterned barrier layer is formed by sputtering.

* * * * *